(12) United States Patent
Dong

(10) Patent No.: US 8,643,138 B2
(45) Date of Patent: Feb. 4, 2014

(54) HIGH BREAKDOWN VOLTAGE INTEGRATED CIRCUIT ISOLATION STRUCTURE

(75) Inventor: Zhiwei Dong, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 189 days.

(21) Appl. No.: 13/174,390

(22) Filed: Jun. 30, 2011

(65) Prior Publication Data

US 2013/0001738 A1 Jan. 3, 2013

(51) Int. Cl.
*H01L 29/06* (2006.01)

(52) U.S. Cl.
USPC ..................................... 257/508; 257/E29.02

(58) Field of Classification Search
USPC .............................. 257/499, 506, 508, E29.02
See application file for complete search history.

(56) References Cited

U.S. PATENT DOCUMENTS

| | | |
|---|---|---|
| 2005/0271147 A1 | 12/2005 | Dupuis |
| 2008/0013635 A1 | 1/2008 | Dupuis |
| 2008/0025450 A1 | 1/2008 | Alfano |
| 2008/0031286 A1 | 2/2008 | Alfano |
| 2008/0260050 A1 | 10/2008 | Dupuis |
| 2008/0267301 A1 | 10/2008 | Alfano |
| 2008/0315925 A1 | 12/2008 | Alfano |
| 2009/0017773 A1 | 1/2009 | Dupuis |
| 2009/0206960 A1 | 8/2009 | Ng |
| 2009/0213914 A1 | 8/2009 | Dong |
| 2009/0243028 A1 | 10/2009 | Dong |
| 2010/0052826 A1 | 3/2010 | Callahan |

OTHER PUBLICATIONS

Alfano—"CMOS Isolators: A Critical Safety Measure for Medical Electronics"; ECN: Electronic Component News; pp. 1-5; (Oct. 1, 2010).
Bell-Alfano—"Digital Isolators: A Space-Saving Alternative to Gate-Drive Transformers in DC-DC Converters"; HOW2POWER Today—Your Power Design Newsletter; pp. 1-5; (Mar. 2010).
CHEN1—"High Speed Digital Isolators Using Microscale On-Chip Transformers"; pp. 1-6; www.analog.com; (2003).
CHEN2—"iCoupler Digital Isolators with 1 kV rms Rating"; pp. 1-3; Analog Devices, Inc.; (2009).
Freescale—"PCB Layout Design Guidelines for Radio Board Using the MC13853 LNA"; Freescale Semiconductor Application Note—Document No. AN3585; p. 1-18; (Jul. 2008).
Gingerich—"ISO72x Digital Isolator Magnetic-Field Immunity"; p. 1-6; Texas Instruments Application Report; (SLLA181A—Jan. 2006—Revised Feb. 2006).
Hill—"Opto-isolators" pp. 1-8; V2.04 5-; downloaded from http://homepages.which.net/~paul.hills/SpeedControl/Optos.html; (Aug. 2004).
Kugelstadt1—"New Digital Capacitive Isolator Training Guide"; ISO74xx & ISO75xx; pp. 1-17; Texas Instruments, New Digital Capacitive Isolators; (Feb. 2010).
Kugelstadt2—"Magnetic-field immunity of digital capacitive isolators"; pp. 1-6; Analog Applications Journal; www.ti.com/aa; (2010).

(Continued)

*Primary Examiner* — Whitney T Moore
(74) *Attorney, Agent, or Firm* — Law Offices of Maximilian R. Peterson

(57) ABSTRACT

A high breakdown voltage integrated circuit isolator device communicates a digital signal from a signal input on one semiconductor die to a signal output on another semiconductor die while providing high voltage isolation between the signal input and the signal output. Each die may include a respective capacitive isolation barrier structure that couple together via a bonding wire between combined top metal/bonding pads of the capacitive isolation barrier structures.

10 Claims, 8 Drawing Sheets

(56) References Cited

OTHER PUBLICATIONS

Silabs1—"Isopro Low Power Five-Channel Digital Isolator"; pp. 1-40; Si8450/51/52/55; (2009).
Silabs2—"Design Considerations for Isolating an I2C Bus or SMBus"; pp. 1-6; AN375; www.silabs.com; (2009).
Silabs3—"Quad-Channel Digital Isolator"; pp. 1-24; Si8440/1/2; www.silabs.com; (2006).
Siliconfaireast—"Plastic Molding Compounds"; pp. 1-2; downloaded from http://www.siliconfareast.com/moldcomp.htm on Dec. 19, 2010.

HIGH BREAKDOWN VOLTAGE INTEGRATED CIRCUIT ISOLATION STRUCTURE

BACKGROUND

The disclosures herein relate generally to isolation structures for integrated circuits, and more particularly, to high voltage isolation structures.

For many electronic systems, it is desirable to provide digital links with high voltage isolation across each link. Such a digital link provides a path between a signal input and a signal output in a manner that isolates the digital signal output from the digital signal input. An opto-isolator is an example of one isolator that provides isolation between a signal input and a signal output. A transformer-type isolator is an example of another isolator that provides isolation between a signal input and a signal output.

BRIEF SUMMARY

In one embodiment, an integrated circuit isolator device is disclosed. The integrated circuit isolator device includes first and second dies. The first die includes first circuitry and a first isolation barrier structure that is coupled to the first circuitry. The first isolation barrier structure includes a combined top plate/bonding pad, a bottom plate, and insulative material therebetween. The bottom plate of the first isolation barrier structure is coupled to the first circuitry. The second die includes second circuitry and a second isolation barrier structure that couples to the second circuitry. The second isolation barrier structure includes a combined top plate/bonding pad, a bottom plate, and insulative material therebetween. The bottom plate of the second isolation barrier structure is coupled to the second circuitry. The integrated circuit isolator device also includes a bond wire coupling the combined top plate/bonding pad of the first isolation barrier structure to the combined top plate/bonding pad of the second isolation barrier structure, such that a signal propagates from the first circuitry, through the first and second isolation barrier structures, and to the second circuitry in voltage-isolated fashion.

In another embodiment, an integrated circuit isolator device is disclosed that includes a first die including transmitter circuitry. A first capacitive isolation structure couples to the transmitter circuitry. The first capacitive isolation structure includes a combined top plate/bonding pad and a bottom plate and insulative material therebetween. The bottom plate of the first capacitive isolation structure is coupled to the transmitter circuitry. The integrated circuit isolator device also includes a second die including receiver circuitry. A second capacitive isolation structure couples to the receiver circuitry. The second capacitive isolation structure includes a combined top plate/bonding pad and a bottom plate and insulative material therebetween. The bottom plate of the second capacitive isolation structure is coupled to the receiver circuitry. A bond wire couples the combined top plate/bonding pad of the first capacitive isolation structure to the combined top plate/bonding pad of the second capacitive isolation structure, such that a signal propagates from the transmitter circuitry, through the first and second capacitive isolation structures, and to the receiver circuitry in voltage-isolated fashion.

In yet another embodiment, an integrated circuit isolator device is disclosed that includes a first die and a second die. The first die includes first circuitry and a first isolation barrier structure that couples to the first circuitry. The first isolation barrier structure includes a combined top plate/bonding pad and a bottom plate and insulative material therebetween. The bottom plate of the first isolation barrier structure is coupled to the first circuitry. The second die includes second circuitry that couples to a bonding pad on the second die. A bond wire couples the combined top plate/bonding pad of the first isolation barrier structure to the bonding pad of the second die, such that a signal propagates from the first circuitry, through the first isolation barrier structure and to the second circuitry in voltage-isolated fashion.

BRIEF DESCRIPTION OF THE DRAWINGS

The appended drawings illustrate only exemplary embodiments of the invention and therefore do not limit its scope because the inventive concepts lend themselves to other equally effective embodiments.

DETAILED DESCRIPTION

Figure 1:
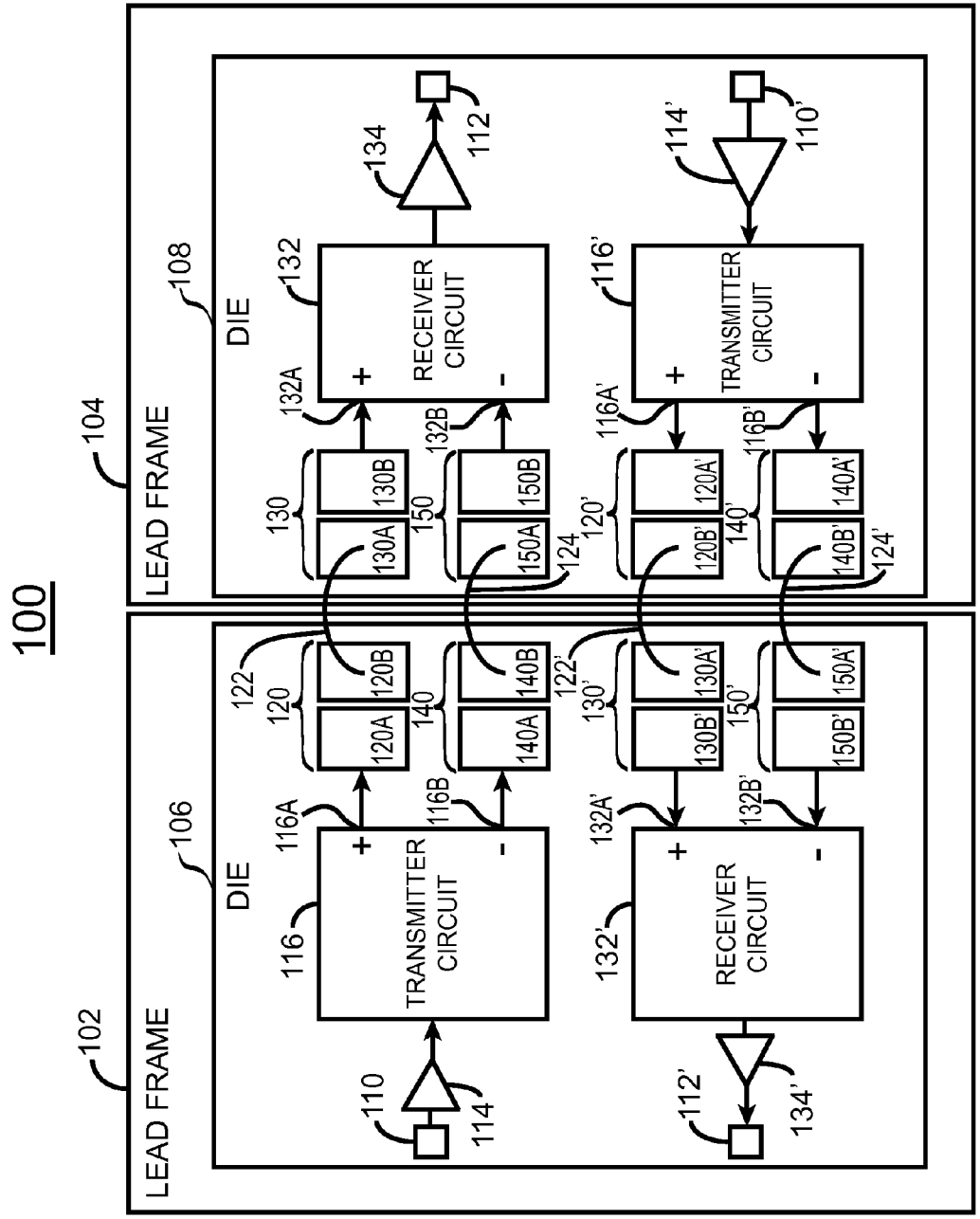
FIG. 1 is a block diagram of one embodiment of the disclosed integrated isolation device.

In one embodiment, the disclosed integrated isolator device employs capacitive coupling to provide high voltage isolation between a digital signal input and a digital signal output. The isolator device includes a transmitter circuit situated on one die and a receiver circuit situated on another die. Using complementary metal oxide semiconductor (CMOS) processes, an isolation barrier structure is built up in layers on one of the two dies, for example the die with the transmitter circuit. This isolation structure is fabricated to include a bottom metal layer and a top metal layer with insulative material, for example silicon oxide, between the bottom and top metal layers. In one embodiment, the isolation structure is an isolation capacitor. A patterned portion of the top metal layer forms both the top plate of the isolation structure and a bonding pad. In this manner, a combined top plate/bonding pad is formed. In one embodiment, the die with the receiver circuit includes another isolation structure fabricated in a manner similar to the isolation structure on the die with the transmitter circuit. A bonding wire is bonded to, and couples between, the combined top plate/bonding pad of the isolation structure on the die with the transmitter circuit and the combined top plate/bonding pad of the isolation structure on the die with the receiver circuit. It should be understood that the roles of the transmitter circuit and receiver circuit may be reversed.

In one embodiment, the disclosed integrated isolator device provides an effective doubling of the breakdown voltage that a single capacitor would offer by distributing voltage and charge across two isolation structures, for example two capacitors on the two die. Circuitry on one die may communicate with circuitry on the other die via a communication link formed by the isolation structure on one die, the isolation structure on the other die and the bonding wire between those two isolation structures. These two isolation structures form an isolation structure pair. One embodiment of the disclosed isolator device includes multiple isolation structure pairs. Each die with an isolator device includes circuitry keep-out regions near the isolation structure. The dimensions of each keep-out region depend on the particular metal layer of the circuitry with which the keep-out region is associated, as discussed in more detail below. Different dimensioned keep-out regions correspond to different respective metal layers of the circuitry.

In one embodiment, selected portions above the top of the die are covered with polyimide to protect the wafer or die surface and avoid a second break down path that may otherwise decrease the breakdown voltage of the integrated isolator device. A polyimide keep-out region is formed around each isolation structure to avoid negatively impacting the breakdown voltage exhibited by the isolation structure.

In another embodiment, a metallic unity ring is formed around each isolation structure's combined top plate/bonding pad to make the surface field of the die more uniform. This arrangement was found to enhance the breakdown voltage of the isolation structure or capacitor inside of the unity ring. In yet another embodiment, providing a minimum distance, LH, between the isolation structure's top plate/bonding pad and the edge of the die may avoid the formation of a second breakdown path that would otherwise reduce the breakdown voltage of the integrated isolator device. In still another embodiment, providing a minimum vertical distance, LV, between the bonding wires and the edge of the die may avoid the formation of another secondary path that would otherwise reduce the breakdown voltage of the integrated isolation device.

FIG. 1 is a block diagram of one embodiment of the disclosed integrated circuit isolator device 100. Note that the elements of the device are not drawn to scale. Isolator device 100 includes lead frames 102 and 104 on which dies 106 and 106 are respectively situated. Die 106 includes an input pad 110 that receives a digital input signal. Die 108 includes an output pad 112 that provides a digital output signal that is voltage-isolated from the digital input signal in the manner discussed in more detail below.

In one embodiment, the circuits and other elements on dies 106 and 108 are fabricated using complementary metal oxide semiconductor (CMOS) processes. A buffer 114 couples input pad 110 to transmitter circuitry 116 that includes differential outputs 116A and 116B. Differential output 116A couples to an isolation barrier structure, i.e. an isolation structure, such as isolation capacitor 120. Isolation capacitor 120 includes a bottom plate 120A and a top plate 120B. For drawing convenience, bottom plate 120A and top plate 120B are illustrated side-by-side. In actual practice, using CMOS fabrication processes, top plate 120B is fabricated to be on top of bottom plate 120A and separated therefrom by layers of dielectric material such as silicon dioxide. In one embodiment, top plate 120B serves dual functions. Top plate 120B not only provides the top plate or electrode of isolation capacitor 120 but also acts as a bonding pad for coupling isolation capacitor 120 to other elements, as described in more detail below. Thus, top plate 120B may be referred to as combined top plate/bonding pad 120B.

Die 108 includes an isolation barrier structure, i.e. an isolation structure, such as isolation capacitor 130 fabricated in a manner similar to that of isolation capacitor 120. Isolation capacitor 130 includes a top plate 130A and a bottom plate 130B. Top plate 130A not only provides the top plate of isolation capacitor 130, but also acts as a bonding pad for coupling isolation capacitor 130 to other elements. Top plate 130A may thus be referred to as combined top plate/bonding pad 130A. A bonding wire 122 is bonded to top plate 120B of isolation capacitor 120 and to top plate 130A of isolation capacitor 130. The bottom plate 130B of isolation capacitor 130 couples to a differential input 132A of c circuit 132. The output of receiver circuit 134 couples via buffer 134 to output pad 112.

In a manner similar to that described above wherein isolation capacitors 120 and 130 provide a signal path between transmitter circuit differential output 116A on die 106 and receiver differential input 132A on die 108, isolation capacitors 140 and 150 provide a signal path between transmitter circuit differential output 116B on transmitter die 106 and receiver differential input 132B on die 108. Isolation capacitor 140 includes bottom pad 140A and top pad 140B. Isolation capacitor 150 includes top pad 150A and 150B. A bonding wire 124 couples top pad 140B of die 106 to top pad 150A of die 108.

The topology described above effectively provides a signal path or digital link between input pad 110 and output pad 112 while providing DC voltage isolation between these pads. In this manner, a signal channel is formed by buffer 114, transmitter circuit 116, isolation capacitors 120, 130, 140 and 150, bonding wires 122 and 124, receiver circuit 132 and buffer 134. One embodiment of integrated isolator device 100 may include multiple signal channels like the one just described. For example, the isolator device 100 shown in FIG. 1 includes another signal channel formed between input 110' and output 112' and including buffer 114', transmitter circuit 116', isolation capacitors 120', 130', 140' and 150', bonding wires 122' and 124', receiver 132' and buffer 134'. Isolation capacitors 120 and 130 are effectively is series. Thus, charge and voltage distributes across both of isolation capacitors and 120 and 130, as well as isolation capacitors 140 and 150, to increase the breakdown voltage that the signal path between input pad 110 and output pad 112 exhibits. In other words, the voltage differential that appears between input pad 110 and output pad 112 is shared equally by isolation capacitors 120 and 130. This increases the total isolation voltage by a factor of approximately 2. Isolation capacitors 120', 130', 140' and 150' likewise provide increased isolation voltage in the signal path between input pad 110' and output pad 112'. In the isolation capacitors described above, the top plate acts as both the bonding pad and top plate of each capacitor.

Figure 2A:
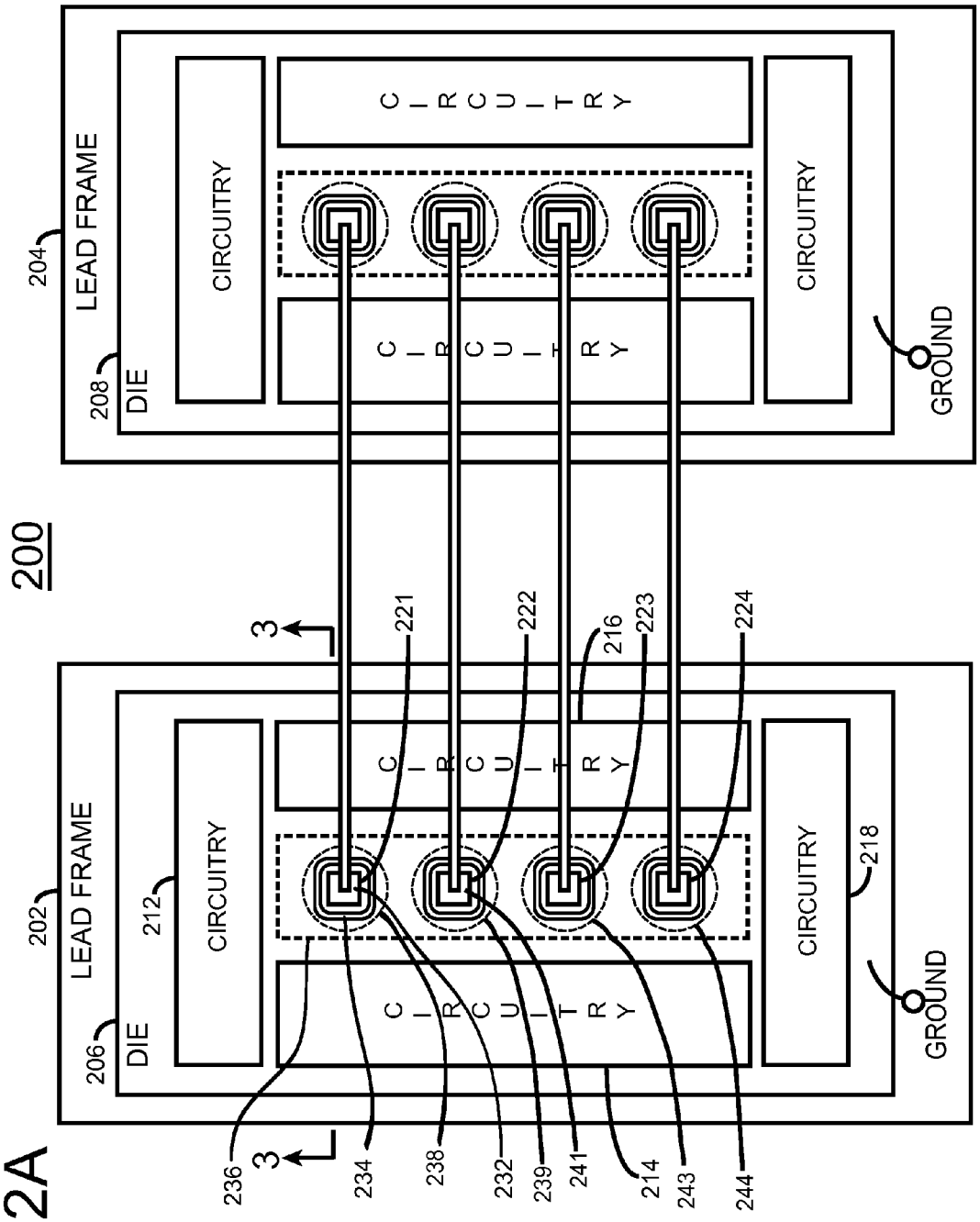
FIG. 2A shows another embodiment of the disclosed integrated isolation device with enhanced breakdown voltage protection.

Other embodiments described below include structures that enable the disclosed integrated isolator device to avoid and/or lessen the likelihood of voltage breakdown along paths other than through the isolation capacitors described above. For example, FIG. 2A shows an integrated circuit isolator device 200 with enhanced breakdown protection. Isolator device 200 includes lead frames 202 and 204 that face one another in a side-by-side relationship. Semiconductor dies 206 and 208 are respectively situated on lead frames 202 and 204. In one embodiment, CMOS processes are used to fabricate circuitry 212, 214, 216 and 218 on die 206 as shown. At the same time that circuitry 212, 214, 216 and 218 are built up on die 206 by CMOS processes, CMOS processes are used to fabricate isolation capacitors 221, 222, 223 and 224 on die 206. While this particular example includes four isolation capacitors, i.e. two channels, other embodiments are possible wherein the number of isolation capacitors is less than or greater than four, depending on the particular application. Isolation capacitor 221 is now discussed as being representative of the other isolation capacitors of integrated isolator device 200. In one embodiment, lead frames 202 and 204 are fixed to a common base (not shown) to hold these lead frames in a fixed position in a side-by-side relationship.

In FIG. 2A, combined top plate/bonding pad 232 is visible on the uppermost layer of integrated circuit device 200. A metallic unity ring 234 surrounds combined top plate/bonding pad 232 to even out the surface field at the uppermost layer of integrated circuit device 200, as described in more detail below. Unity ring 234 is spaced apart from combined top plate/bonding pad 232 of isolation capacitor 221 as shown. Unity ring 235 exhibits a generally ring-like or annular geometry that may or may not be circular.

Die 206 includes a circuitry keep-out region 236 in which circuitry such as the metallic layers in circuitry 212, 214, 216 and 218 is not permitted to extend. More particularly, a keep-out region is a zone or area of integrated isolator device 200 in which the metal associated with such circuitry is not permitted to extend. In one embodiment, die 206 may include a different respective keep-out region for each metal layer of circuitry. FIG. 2A shows a simplified embodiment wherein a single keep-out region 236 for the metal of the top layer of circuitry 212, 214, 216 and 218 is illustrated. However, it should be understood that die 206 may include other keep-out regions for the other metal layers of circuitry 212, 214, 216 and 218 that are under the top layer of this circuitry. The keep-out regions for these other layers are shown and discussed below with reference to FIG. 2C and FIGS. 3A-3C.

A rectangular dashed line is used in FIG. 2A to depict the boundary of circuitry keep-out region 236 for the uppermost metal layer of circuitry 212, 214, 216 and 218. Circuitry keep-out region 236 is a metal keep-out region wherein metal such as found in circuitry 212, 214, 216 and 218 is not allowed. This configuration avoids undesired interaction between circuitry and the metal plates of an isolation capacitor that may otherwise negatively impact the performance of the isolation capacitors 221, 222, 223 and 224. The dimensions selected for circuitry keep-out region 236 are sufficiently large to avoid interaction between the metal layers of circuitry 212, 214, 216, 218 and isolation capacitors 221, 222, 223 and 224.

Figure 2B:
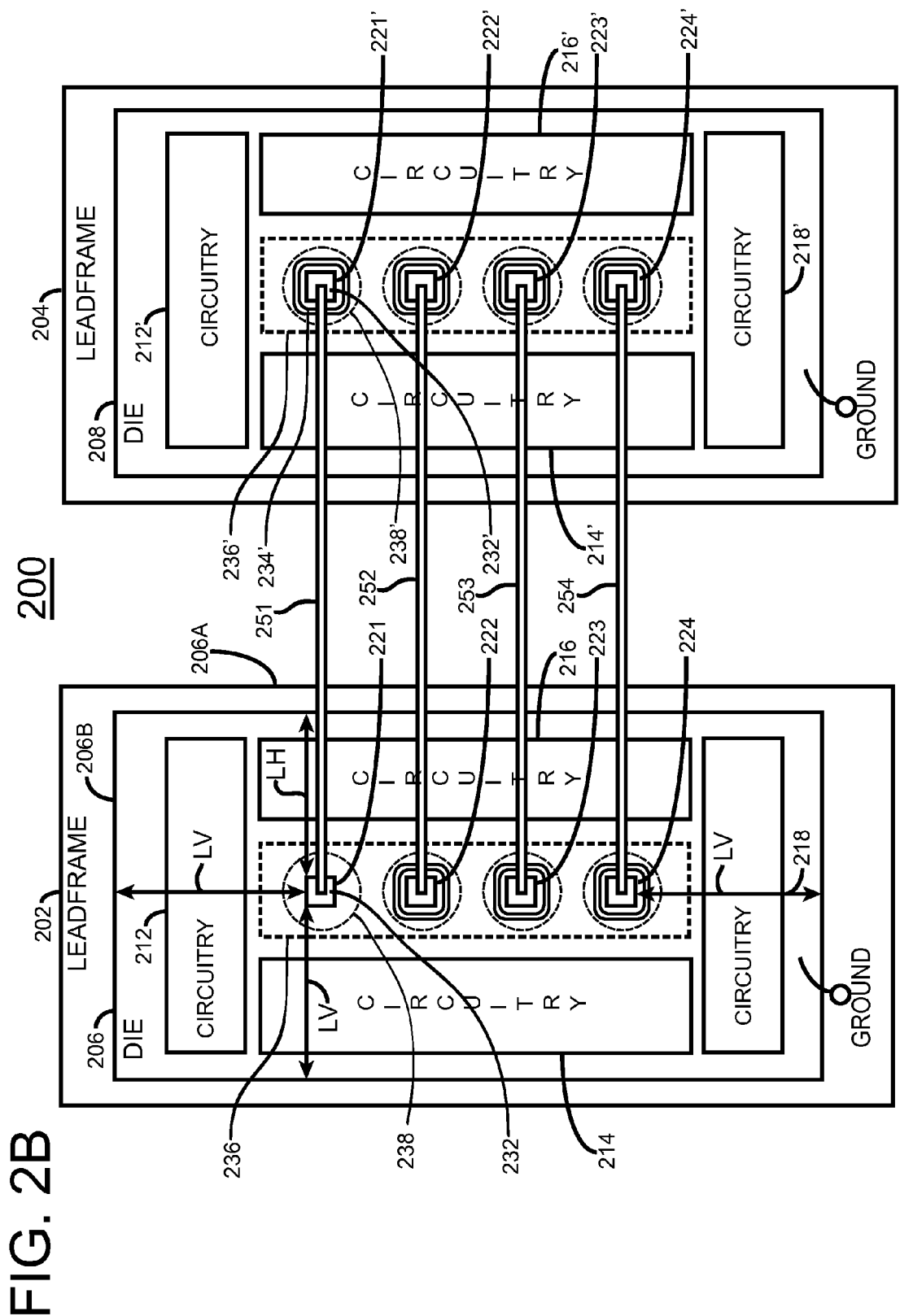
FIG. 2B shows the disclosed integrated isolation device of FIG. 2A in more detail.

An insulative material, for example a voltage insulative material, such as polyimide covers the uppermost surface of the structures on die 206 except for the voltage insulative keep-out regions, such as region 238, that surround each of isolation capacitors 221, 222, 223 and 224. For discussion purposes, these keep-out regions are referred to as polyimide keep-out regions although other voltage insulative materials may be used in place of polyimide. Polyimide keep-out region 238 may also be referred to as an insulative material keep-out region. FIG. 2B shows integrated circuit isolator device 200 with unity ring 234 removed to more clearly depict a representative polyimide keep-out region 238. The polyimide layer that covers most of device 100 except for the polyimide keep-out regions is not actually shown in FIGS. 2A-2C because it would obscure many of the structures of interest that are below this polyimide layer. However, this polyimide layer is visible in FIG. 3C, discussed below.

Figure 2C:
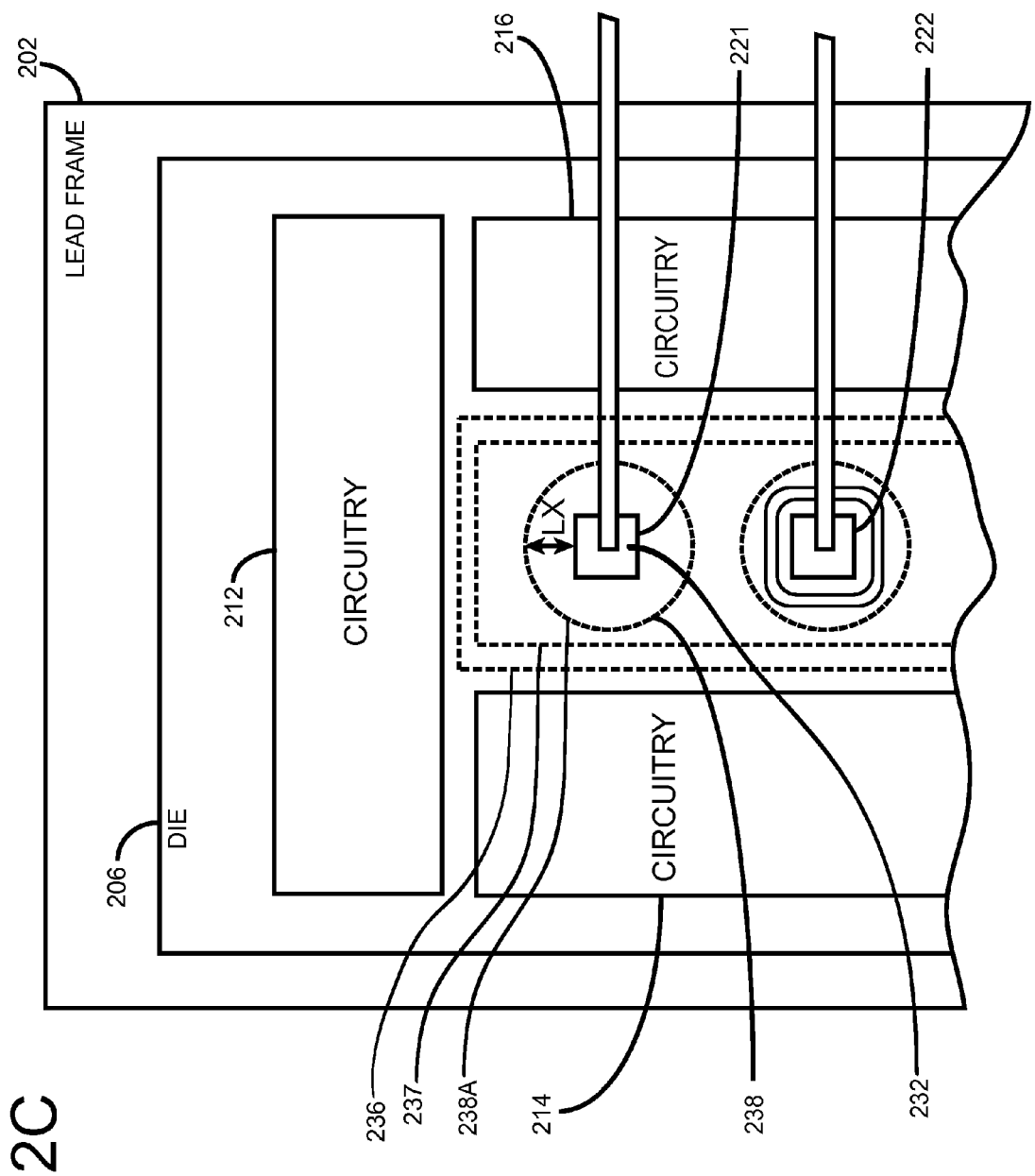
FIG. 2C is a close-up view of a portion of the disclosed integrated isolation device.

In the embodiment of FIG. 2B, the geometry of polyimide keep-out region 238 is circular although geometries other than circular, such as rectangular or elliptical may be employed as well. FIG. 2C is a close-up view of a portion of device 200 of FIG. 2B that is enlarged to make the polyimide keep-out distance, LX, more visible between combined top metal/bonding pad 232 and polyimide boundary 238A. The polyimide keep-out distance, LX, is selected to reduce surface breakdown in device 200. In one embodiment, the polyimide keep-out distance, LX, is approximately 25 μm for example. In the illustrated embodiment, the polyimide keep-out distance, LX, assures that more than just the combined top plate/bonding pad 232 is free of polyimide, but also surface areas adjacent the combined top plate/bonding pad 232 are free of polyimide as well. This arrangement serves to reduce or eliminate surface breakdown.

In the above-described embodiment, providing voltage insulative material such as polyimide to the upper surface of device 200 as described results in placement of polyimide in the region between the keep-out regions of adjacent isolation capacitors. Referring to FIG. 2A for example, polyimide is present between the circular keep-out region 238 of isolation capacitor 221 and the circular keep-out region 239 of isolation capacitor 222. In FIG. 2A, both combined top plate/bonding pad 232 and 241 are used as bonding pads. Placing polyimide between combined top plate/bonding pad 232 and 241 while avoiding placement of polyimide in the respective keep-out regions 238 and 239 results in a longer breakdown path between these adjacent pads than would otherwise occur if no polyimide was present at this location. This polyimide placement arrangement is also helpful to provide a longer breakdown path when combined top plate/bonding pad 232 is used as a bonding pad, i.e. a pad with a bonding wire bonded thereto, and combined top plate/bonding pad 241 is not used as a bonding pad, i.e. a pad that is an unbonded pad without a bonding wire bonded thereto. In this manner, a higher breakdown voltage may be provided to device 200. FIG. 2A also shows polyimide keep-out regions 243 and 244 for isolation capacitor 223 and 224, respectively.

Returning to FIG. 2B, it is seen that many of the structures that are fabricated on die 208 are similar to structures fabricated on die 206 that has been discussed above. Similar structures on die 208 are indicated by using the same element number as on die 206 followed by an apostrophe (e.g. isolation capacitor 221'). For example, circuitry 212', 214', 216' and 218' of die 208 are similar to circuitry 212, 214, 216 and 218 of die 206, except that one or more of circuitry 212', 214', 216' and 218' may be configured to receive signals from the elements of die 206. Likewise, isolation capacitors 221', 222', 223' and 224' of die 208 are similar to isolation capacitors 221, 222, 223 and 224 of die 206. Combined top plate/bonding pad 232', unity ring 234', circuitry keep-out region 236', polyimide keep-out region 238' of die 208 are respectively similar to combined top plate/bonding pad 232, unity ring 234, circuitry keep-out region 236 and polyimide keep-out region 238 of die 206.

Respective bonding wires couple bonding pad pairs of the adjacent dies 206 and 208 together, as seen in FIG. 2B. For example, one end of bonding wire 251 is bonded to bonding pad 232 and the remaining end of bonding wire 251 is bonded to bonding pad 232'. In this manner, a digital signal propagates from circuitry on die 206 to circuitry on die 208. Bonding wires 252, 253 and 254 couple the remaining three bonding pad pairs together as illustrated in FIG. 2B.

In FIG. 2B, each combined top plate/bonding pad of an isolation structure, for example pad 232, is positioned a predetermined distance, LH, away from the adjacent die edge to prevent breakdown from the respective bonding wire, such as bonding wire 251, to the die. The bonding wire's distance to the die edge depends on the pad to die distance. More particularly, the larger the pad to die distance becomes, the larger the pad bonding wire to die edge distance, LH, becomes. For example, LH represents the minimum distance between a combined top plate/bonding pad, such as pad 232 where an end of bonding wire 251 attaches, and the nearest side of die 206, for example die edge 206A, as illustrated. This distance or spacing is determined by the relationship wherein LH is greater than the desired isolation voltage divided by twice the material strength. Assuming an isolation voltage of 5 kV and a material strength of 525 V/μm, the distance LH between the pad 232 and die edge 206A may be greater than or equal to 100 μm. LH is measured horizontally with respect to the upper surface of isolator device 200, i.e. in the same plane as die 206, as seen in FIG. 2B. In one embodiment, circuitry 212 of die 206 includes a digital signal input (not shown in FIG. 2B) and circuitry 212' of die 208 includes a digital signal output (not shown in FIG. 2B). The digital signal input is shown in FIG. 1 as digital signal input 110 and the digital signal output is shown as output 112.

FIG. 2C is a close-up view of a portion of device 200 of FIG. 2B that is enlarged to show representative circuitry keep-out regions 236 and 237. As discussed above, integrated isolator device 200 may employ multiple circuitry keep-out regions. For example, integrated isolator device 200 may employ a respective keep-out region for each of the metal layers that form circuitry 212, 214, 216 and 218. The lateral dimensions of each of these keep-out regions increases from the bottom metal layer to the top metal layer of circuitry 212, 214, 216 and 218, as will be seen more clearly in the discussion below of the device stack-up depicted in FIGS. 3A-3C. In FIG. 2C, circuitry keep-out region 236 is the keep-out region for the top metal layer (not shown) of circuitry 212, 214, 216 and 218. Circuitry keep-out region 237 is the circuitry keep-out region for the bottom metal layer (not shown) of circuitry 212, 214, 216 and 218. Other embodiments may include additional circuitry keep-out regions (not shown) for those metal layers between the top metal layer and the bottom metal layer of circuitry 212, 214, 216 and 218.

Figure 3A:
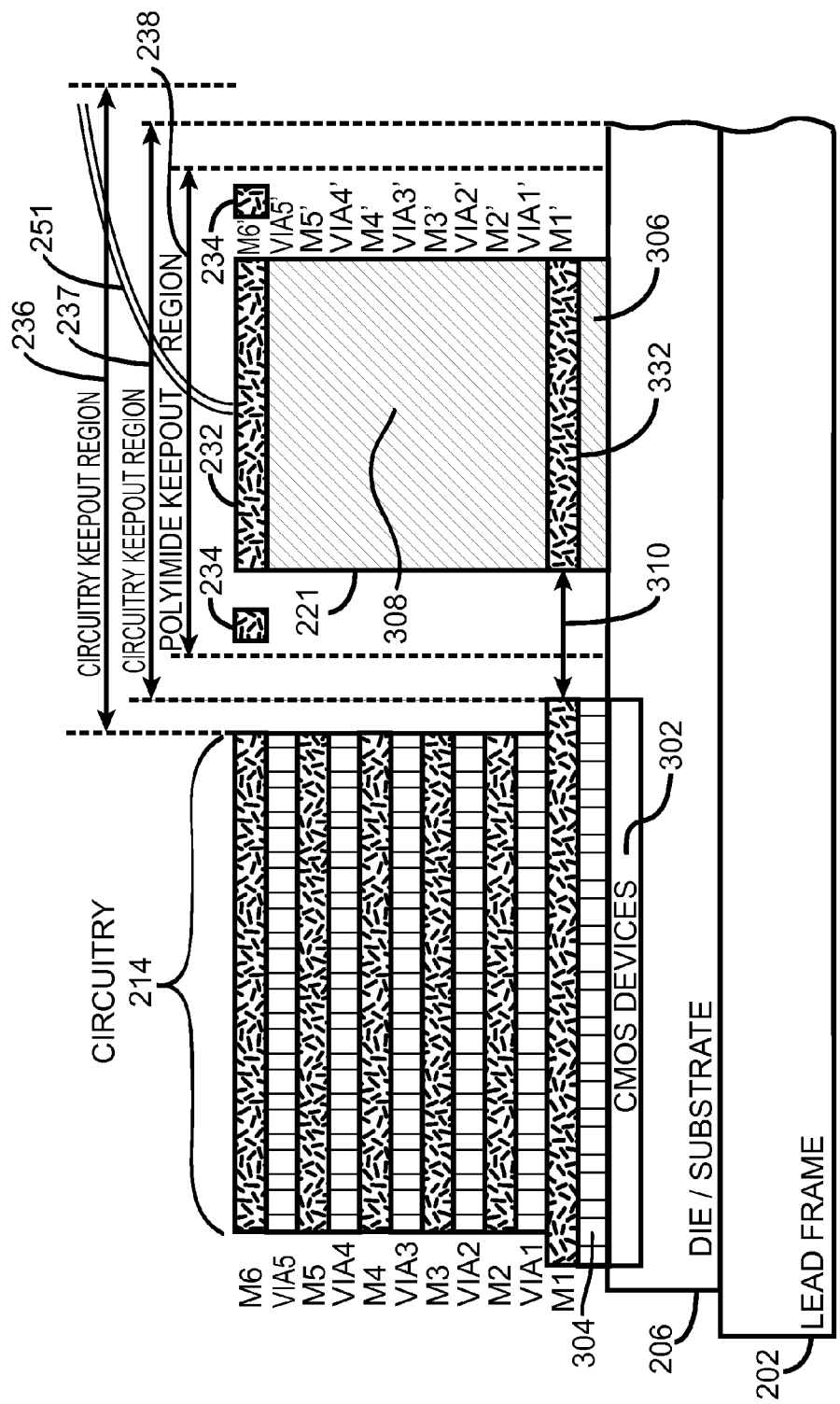
FIGS. 3A-3C are cross sections of the disclosed integrated isolation device each with increasing detail.

FIG. 3A is a cross sectional view of a portion of integrated isolator device 200 taken along section line 3-3 of FIG. 2A. Semiconductor die 206 is situated on lead frame 202. Multiple CMOS devices 302 are fabricated on die 206 as part of forming circuitry 214. An insulative layer 304 of material such as silicon dioxide including connective vias therein is situated on CMOS devices 302 to form connections between the CMOS devices and other layers that are built up above CMOS devices 302. Alternating metal layers of patterned metal (M#) and via layers (VIA#) are built up on CMOS devices 302 using CMOS fabrication methodology to form desired connections between CMOS devices 302 and other elements. The resultant stack of layers above CMOS devices 302 in this particular embodiment includes metal layer M1, via layer VIA1, metal layer M2, via layer VIA2, metal layer M3, via layer VIA3, metal layer M4, via layer VIA4, metal layer M5, via layer VIA5, and metal layer M6. CMOS devices 302, insulative layer 304 with vias couple together with the above-described alternating metal and via layers to form circuitry 214.

A layer of insulative material 306 such as silicon dioxide is situated on die 206 to form an insulative base on which an isolation structure, namely capacitor 221, is fabricated. The layers that form capacitor 221 are built up layer by layer by CMOS processes at the same time that the layers of circuitry 214 are built up by CMOS processes. More specifically, in one embodiment, at the same time that metal layer M1 is formed, metal layer M1' is formed to provide a bottom plate 332 for capacitor 221. Arrow line 310 indicates that bottom plate 332 is coupled to metal layer M1 to connect circuitry 214 to isolation capacitor 221. At the same time that layers VIA1, M2, VIA2, M3, VIA3, M4, VIA4, M5 and VIA5 are built up one above the other, respective silicon dioxide layers VIA1', M2', VIA2', M3', VIA3', M4', VIA4', M5' and VIA5' are built up above bottom plate 332 to form the dielectric region 308 of capacitor 221. At the same time that metal layer M6 of circuitry 214 is formed, the combined top plate/bonding pad 232 and unity ring 234 are formed as patterned metal layer M6'.

A horizontal arrow indicates the location of the polyimide keep-out region 238 that surrounds combined top plate/bonding pad 232. In one embodiment, no polyimide is permitted within polyimide keep-out region 238. The forming of an insulative polyimide layer on device 200 is discussed below in more detail with respect to FIG. 3C. In FIG. 3A, another horizontal arrow indicates the location of circuitry keep-out region 236. In the embodiment shown, circuitry 214 as well as other metal-containing circuitry is located outside of circuitry keep-out region 236. More specifically, circuitry keep-out region 236 is for the M6 metal layer of circuitry 214. In other words, the M6 metal layer of circuitry 214 does not extend into circuitry keep-out region 236. FIG. 3A shows another keep-out region 237 for the M1 layer of circuitry 214. In other words, the M1 metal layer near the bottom of circuitry 214 does not extend into circuitry keep-out region 237.

Although not illustrated in FIG. 3A, integrated isolator device 200 may include a respective circuitry keep-out region for each of the metal layers that form circuitry 214. The size of the keep-out regions becomes progressively larger from keep-out region 237 for the M1 metal layer adjacent the bottom plate 332 of isolation capacitor 308 to keep-out region 236 for the M6 metal layer adjacent the top plate 232 of isolation capacitor 221. For example, with respect to the M1 metal layer, keep-out region 237 exhibits a keep-out distance between the M1 metal layer and the isolation structure 221 of approximately 20 μm in one embodiment that may achieve 5 kV of isolation. The keep-out distance for the M2 layer is approximately 20 μm in one embodiment. The keep-out distance for the M4/M3 metal layers is approximately 40 μm in one embodiment. The keep-out distance for the M6/M5 metal layers is approximately 80 μm in one embodiment.

Figure 3B:
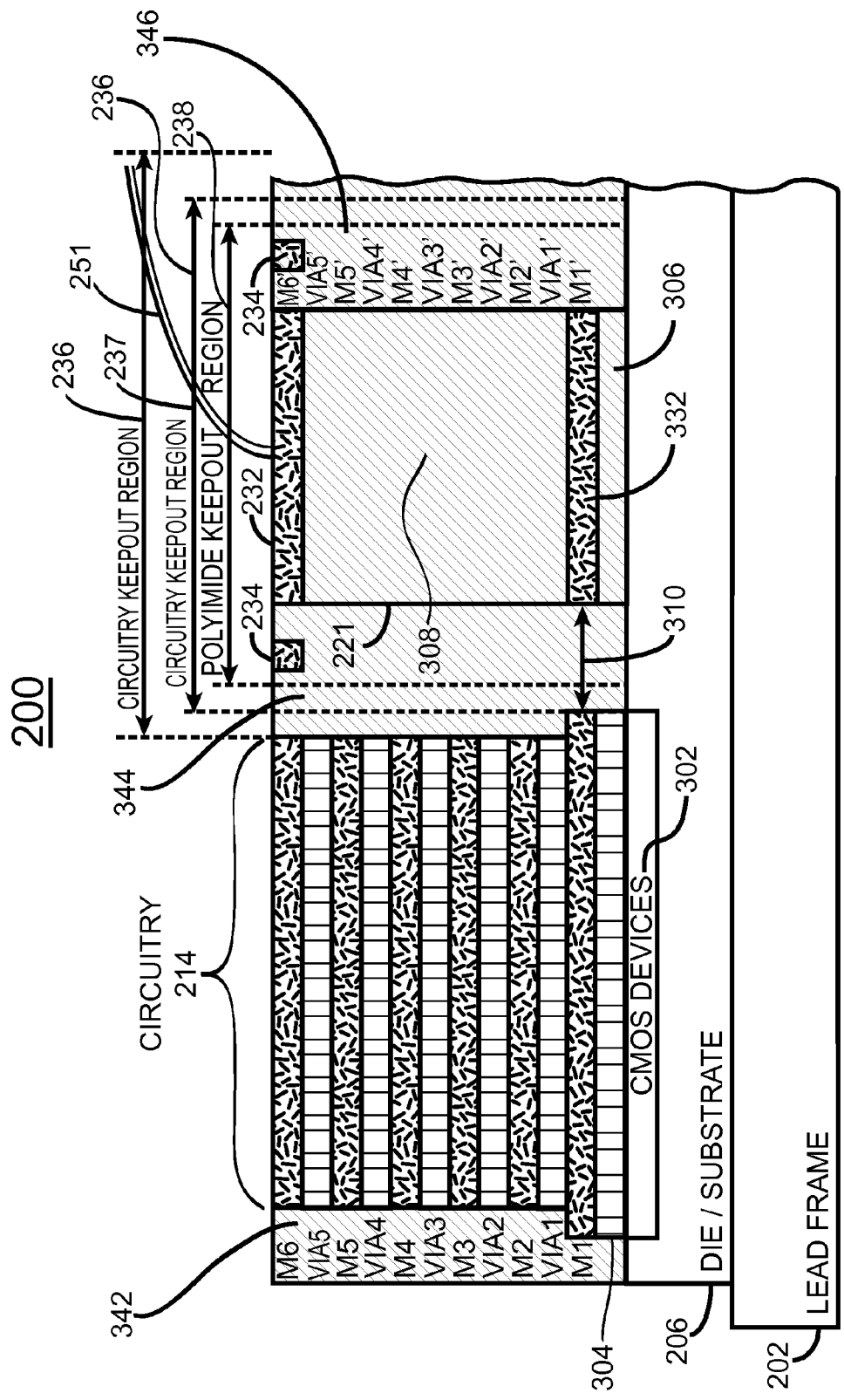

In actual practice, while the layers of circuitry 214 and isolation structure 221 are being formed, any open areas are filled in layer on layer with insulative material such as silicon dioxide using CMOS processes. Silicon dioxide fill-in regions 342, 344 and 346 are thus formed as shown in FIG. 3B. Another silicon dioxide fill-in region 348 is shown in the more detailed FIG. 3C.

Figure 3C:
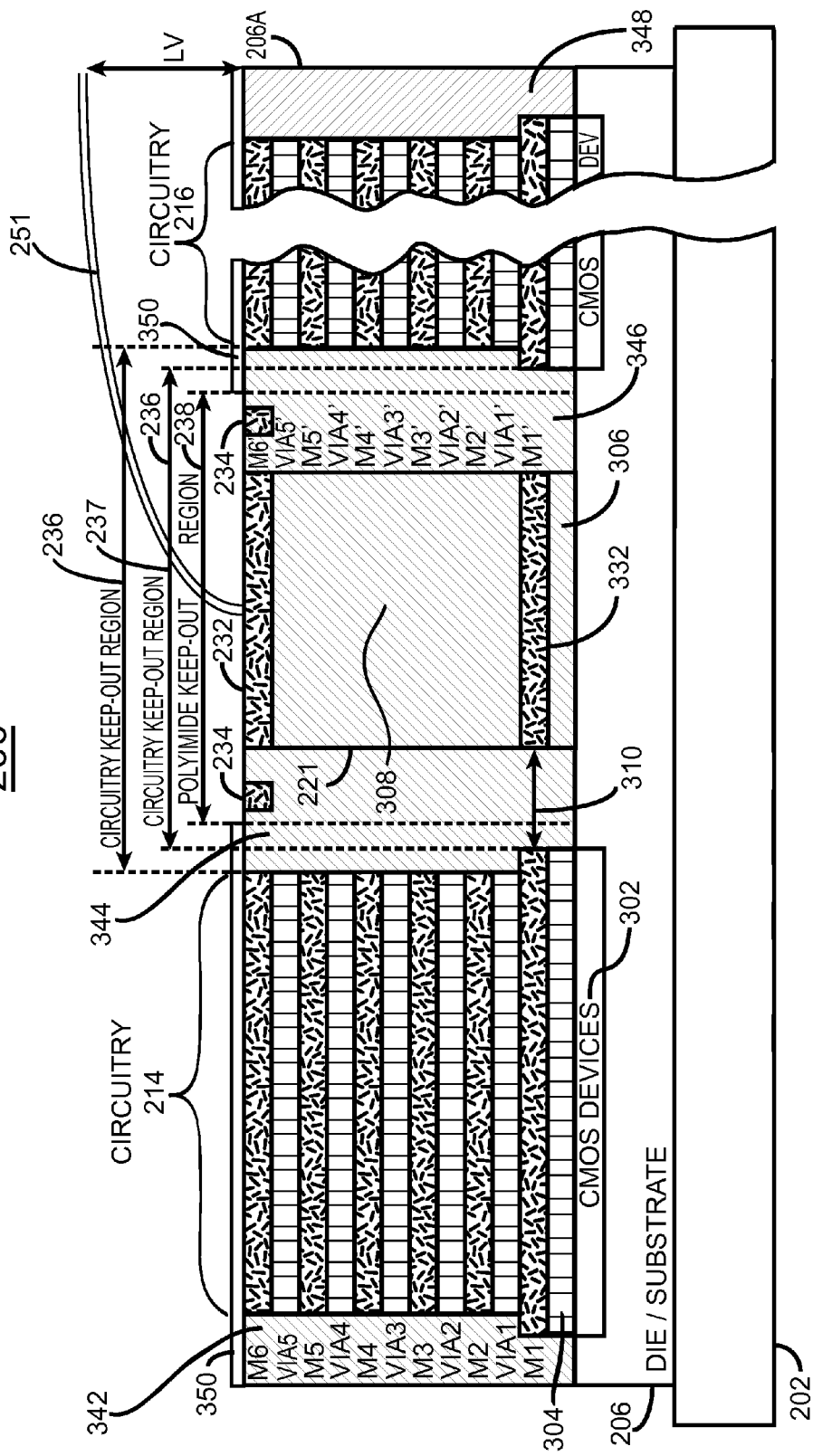

FIG. 3C depicts integrated isolator device 200 after a polyimide layer 350 is deposited or otherwise formed thereon except for the polyimide keep-out regions 238 around each combined top plate/bonding pad such as pad 232. In one embodiment, bonding wires such as bonding wire 251 are kept a minimum vertical distance, LV, above and/or away from the adjacent die edge 206A to prevent device breakdown from the bonding wire to the die. This distance or spacing is determined by the relationship wherein LV should be greater than the desired isolation voltage divided by twice the material strength. Assuming an isolation voltage of 5 KV and a material strength of 525 V/μm, the distance LV between the bonding wire 251 and die edge 206A should be greater than or equal to 100 μm. Material strength here refers to package material that is called mold compound. LV is measured in a direction normal to the upper surface of isolator device 200 as shown in FIG. 3C.

FIG. 3C shows integrated isolator device 200 including a unity ring 234 in cross-section. FIG. 2A shows unity ring 234 in a top view. In one embodiment, unity ring 234 is square with highly rounded corners. In another embodiment, unity ring 235 may be circular. Unity ring 234 makes the surface field along the uppermost surface of isolator device 200 more uniform or evenly distributed. In this manner, the ability of isolator device 200 to provide a high breakdown voltage is enhanced.

In this manner, a high isolation voltage integrated circuit device is provided that exhibits voltage isolation between a signal input and a signal output. More particularly, referring again to FIG. 2B, an input digital signal passing from circuitry on die 206 though isolation capacitor 221, across bonding wire 251, through isolation capacitor 221' and to circuitry 212' on die 212' is provided with voltage isolation by isolation capacitors 221 and 221'. Circuitry 212' receives the voltage-isolated digital signal and may provide output to the voltage-isolated digital signal as a digital output signal. The digital output signal may be provided to other devices and circuits not shown. This voltage isolation provided by isolation capacitors 221 and 221' is enhanced by the other elements and topology discussed above.

Figure 4:
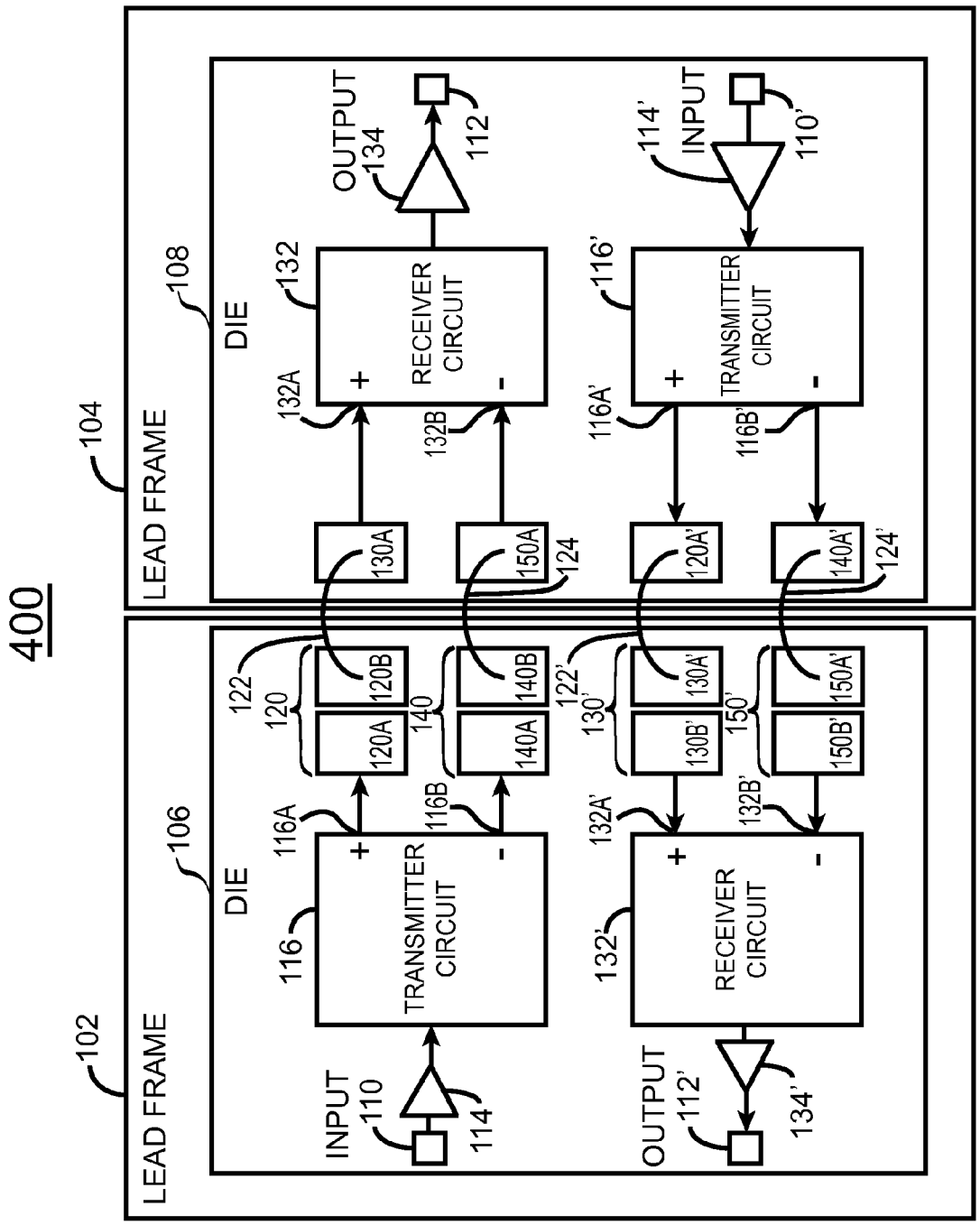
FIG. 4 is a block diagram of another embodiment of the disclosed integrated isolation device.

FIG. 4 shows an alternative embodiment of the disclosed integrated isolator device as integrated isolator device 400. Integrated isolator device 400 of FIG. 4 is similar to integrated isolator device 200 of FIG. 1 except that die 108 does not employ the disclosed isolation structures, namely capacitive isolation structures 130, 150, 120' and 140'. Consequently, integrated isolator device 400 of FIG. 4 exhibits approximately one half of the isolation voltage that integrated isolator device 100 of FIG. 1 exhibits. It has been found that using the disclosed isolation structures on one die but not the other die, as shown in FIG. 4, provides the freedom to fabricate the two die with many different CMOS processes, such as a 90 nm process, a 130 nm process and a 0.18 μm process, for example.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An integrated circuit isolator device, comprising:
   a first die including:
      first circuitry, and
      a first isolation barrier structure, coupled to the first circuitry, the first isolation barrier structure including a combined top plate/bonding pad and a bottom plate and insulative material therebetween, the bottom plate of the first isolation barrier structure being coupled to the first circuitry;
      a first circuitry keep-out region, situated on the first die proximate the first circuitry, wherein a metal layer of the first circuitry does not extend into the first circuitry keep-out region;
   a second die including:
      second circuitry, and
      a second isolation barrier structure, coupled to the second circuitry, the second isolation barrier structure including a combined top plate/bonding pad and a bottom plate and insulative material therebetween, the bottom plate of the second isolation barrier structure being coupled to the second circuitry;
   a bond wire coupling the combined top plate/bonding pad of the first isolation barrier structure to the combined top plate/bonding pad of the second isolation barrier structure, such that a signal propagates from the first circuitry, through the first and second isolation barrier structures, and to the second circuitry in voltage-isolated fashion.

2. The integrated circuit isolator device of claim 1, wherein the first isolation barrier structure is a capacitive isolation structure and the second isolation barrier structure is a capacitive isolation structure.

3. An integrated circuit isolator device, comprising:
   a first die including:
      transmitter circuitry, and
      a first capacitive isolation structure, coupled to the transmitter circuitry, the first capacitive isolation structure including a combined top plate/bonding pad and a bottom plate and insulative material therebetween, the bottom plate of the first capacitive isolation structure being coupled to the transmitter circuitry;
      a first circuitry keep-out region, situated on the first die and surrounding the combined top plate/bonding pad of the first capacitive isolation structure, the first circuitry being configured such that a metal layer of the first circuitry does not extend into the first circuitry keep-out region;
   a second die including:
      receiver circuitry, and
      a second capacitive isolation structure, coupled to the receiver circuitry, the second capacitive isolation structure including a combined top plate/bonding pad and a bottom plate and insulative material therebetween, the bottom plate of the second capacitive isolation structure being coupled to the receiver circuitry;
   a bond wire coupling the combined top plate/bonding pad of the first capacitive isolation structure to the combined top plate/bonding pad of the second capacitive isolation structure, such that a signal propagates from the transmitter circuitry, through the first and second capacitive isolation structures, and to the receiver circuitry in voltage-isolated fashion.

4. The integrated circuit isolator device of claim 3, further comprising a plurality of circuitry keep-out regions situated on the first die and surrounding the combined top plate/bonding pad of the first capacitive isolation structure, the circuitry keep-out regions of the plurality of circuitry keep-out regions corresponding to respective metal layers of the transmitter circuitry.

5. The integrated circuit isolator device of claim 4, wherein each circuitry keep-out region exhibits respective dimensions, the dimensions of the circuitry keep-out regions increasing in size from a bottom of the first capacitive isolation structure to a top of the first capacitive isolation structure.

6. The integrated circuit isolator device of claim 3, further comprising:
   a first insulative material situated on a top surface of the first die except for a first insulative material keep-out region that surrounds the combined top plate/bonding pad of the first capacitive isolation structure.

7. A method of fabricating an integrated circuit isolator device, the method comprising:
   fabricating in a first die: transmitter circuitry, and a first capacitive isolation structure, coupled to the transmitter circuitry, the first capacitive isolation structure including a combined top plate/bonding pad and a bottom plate and insulative material therebetween, the bottom plate of the first capacitive isolation structure being coupled to the transmitter circuitry;

fabricating a first circuitry keep-out region, situated on the first die and surrounding the combined top plate/bonding pad of the first capacitive isolation structure, the first circuitry being configured such that a metal layer of the first circuitry does not extend into the first circuitry keep-out region;

fabricating in a second die: receiver circuitry, and a second capacitive isolation structure, coupled to the receiver circuitry, the second capacitive isolation structure including a combined top plate/bonding pad and a bottom plate and insulative material therebetween, the bottom plate of the second capacitive isolation structure being coupled to the receiver circuitry;

coupling with a bond wire the combined top plate/bonding pad of the first capacitive isolation structure to the combined top plate/bonding pad of the second capacitive isolation structure, such that a signal propagates from the transmitter circuitry, through the first and second capacitive isolation structures, and to the receiver circuitry in voltage-isolated fashion.

8. The method of claim 7, further comprising fabricating a plurality of circuitry keep-out regions situated on the first die and surrounding the combined top plate/bonding pad of the first capacitive isolation structure, the circuitry keep-out regions of the plurality of circuitry keep-out regions corresponding to respective metal layers of the transmitter circuitry.

9. The method of claim 8, wherein each circuitry keep-out region exhibits respective dimensions, the dimensions of the circuitry keep-out regions increasing in size from a bottom of the first capacitive isolation structure to a top of the first capacitive isolation structure.

10. The method of claim 7, further comprising fabricating a first insulative material situated on a top surface of the first die except for a first insulative material keep-out region that surrounds the combined top plate/bonding pad of the first capacitive isolation structure.

* * * * *